United States Patent
Saito

(10) Patent No.: US 7,342,182 B2
(45) Date of Patent: Mar. 11, 2008

(54) PRINTED BOARD

(75) Inventor: Akiyoshi Saito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/134,363

(22) Filed: May 23, 2005

(65) Prior Publication Data

US 2006/0185891 A1    Aug. 24, 2006

(30) Foreign Application Priority Data

Feb. 18, 2005  (JP) .............................. 2005-041484

(51) Int. Cl.
*H01R 12/04* (2006.01)
*H05K 1/11* (2006.01)

(52) U.S. Cl. .................... 174/261; 361/772; 361/776

(58) Field of Classification Search ................ 174/260, 174/261; 361/772–776
See application file for complete search history.

(56) References Cited

U.S. PATENT DOCUMENTS

| | | | | |
|---|---|---|---|---|
| 5,426,266 A | * | 6/1995 | Brown et al. ................ | 174/267 |
| 6,115,262 A | * | 9/2000 | Brunner et al. .............. | 361/774 |
| 6,217,990 B1 | * | 4/2001 | Asai et al. .................... | 428/210 |
| 6,700,204 B2 | * | 3/2004 | Huang et al. ................ | 257/774 |
| 2002/0016090 A1 | * | 2/2002 | Haba et al. .................... | 439/70 |
| 2002/0084105 A1 | * | 7/2002 | Geng et al. .................. | 174/261 |
| 2002/0125043 A1 | * | 9/2002 | Yoshida ....................... | 174/261 |
| 2003/0020178 A1 | * | 1/2003 | Ohashi et al. ............... | 257/783 |

FOREIGN PATENT DOCUMENTS

| | | |
|---|---|---|
| JP | 61-158198 | 7/1986 |
| JP | 6-13181 | 2/1994 |
| JP | 2004-039732 | 2/2004 |

* cited by examiner

*Primary Examiner*—Jeremy C Norris
(74) *Attorney, Agent, or Firm*—Westerman, Hattori, Daniels & Adrian, LLP.

(57) ABSTRACT

A printed board suitable for having a LSI surface-mounted thereto and improves high-speed transfer characteristic while maintaining the circumference of a pad formed on the printed board. The pad is a connector pad consisting of a conductor pattern, and the area of the conductor pattern forming the pad is smaller than an area determined based on the circumference of the conductor pattern that forms the pad.

4 Claims, 7 Drawing Sheets

PRINTED BOARD

BACKGROUND OF THE INVENTION

1. Field of the Invention

The present invention relates to a printed board in which a connector pad consisting of a conductor pattern is formed, and more particularly, to a printed board suitable for having a LSI surface-mounted thereto.

2. Description of the Related Art

It is desired that printed boards for LSI package and the like have high-speed transmission performance. Currently, frequency band, which meets a condition that S parameter is in the range from −10 to −20 dB, is about 5 GHz. Obviously, it is expected that there will be a growing demand for higher transmission performance than before. Various ideas have been proposed to realize high-speed transmission (see Japanese Utility Model Application Publication No. 6-13181, Japanese Patent Application Publication No. 61-158198, and Japanese Patent Application Publication No. 2004-39732). However, technological development to realize still faster transmission is desired.

Printed boards have a problem that the transfer characteristic such as S parameter is hard to improve because the shape of the pad on the printed board is larger than that of the signal transmission line.

To address this problem, there has been proposed a technique of forming a pad with small circumference (Japanese Utility Model Application Publication No. 6-13181 for example). However, because the circumference of a pad is important in relation to the resistance to a vibration or thermal stress applied by a LSI connected to the pad, if the circumference of a pad is made small, there arises another problem that the pad cannot resist to vibrations or heat so that it easily peels off the printed board.

SUMMARY OF THE INVENTION

In view of the above circumstances, the present invention provides a printed board having a pad whose transfer characteristic is improved while maintaining a sufficient circumference.

A printed board according to the present invention includes: a connector pad consisting of a conductor pattern, wherein the area of the conductor pattern forming the pad is smaller than an area determined based on the circumference of the conductor pattern that forms the pad.

The printed board may include a LSI surface-mounted thereto, wherein the pad is soldered to the LSI.

Further, in the printed board, the pad may consist of a conductor pattern whose circumference is partially indented, alternatively, the pad may consist of a conductor pattern having an opening.

As described above, a printed board according to the present invention has a pad that maintains a sufficient circumference while having a small area so that the resistance to vibrations or heat can be preserved while the transfer characteristic can be improved.

DETAILED DESCRIPTION OF THE EMBODIMENTS

Embodiments of the present invention will be described below.

Figure 1:
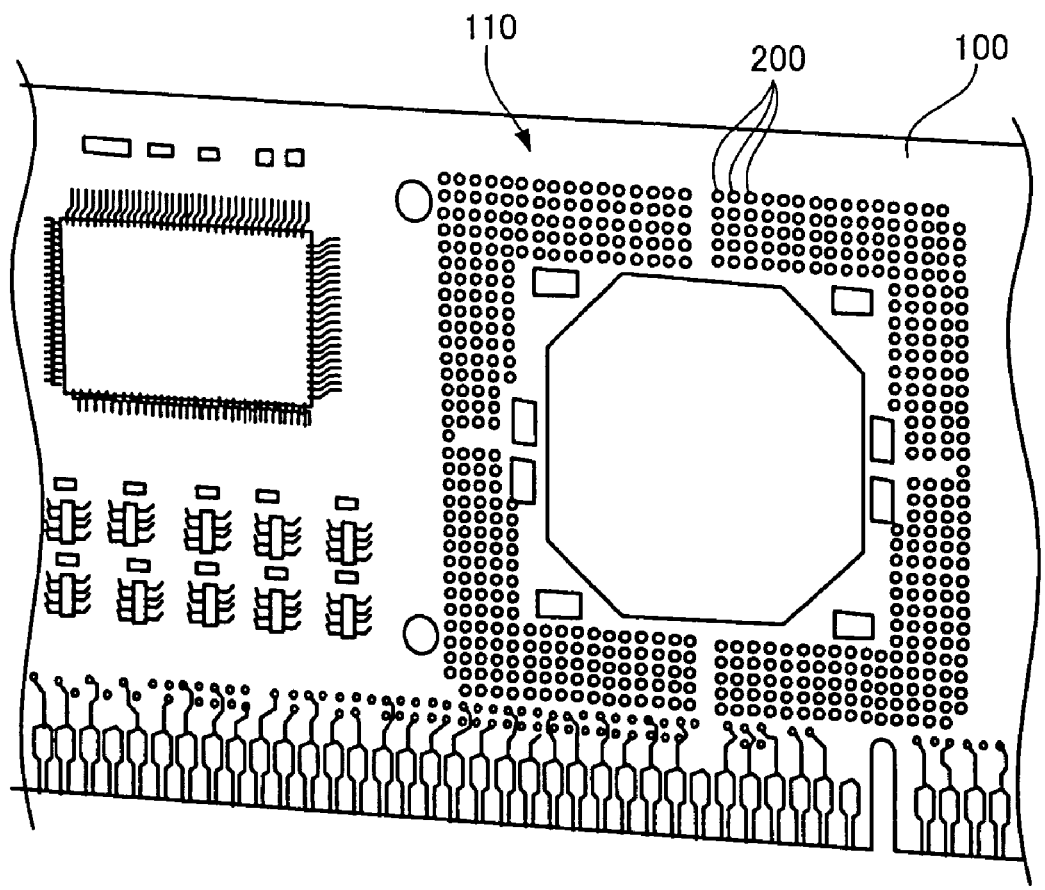
FIG. 1 shows an embodiment of a printed board according to the present invention.

FIG. 1 shows an embodiment of a printed board according to the present invention.

A printed board 100 shown in FIG. 1 has a LSI mounting section 110 on which a BGA (Ball Grid Array) package is mounted. The BGA package has a LSI mounted thereon. On the LSI mounting section 110, there are formed multiple pads 200 that are soldered to multiple electrodes (not shown) arranged on the undersurface of the BGA package.

Figure 2:
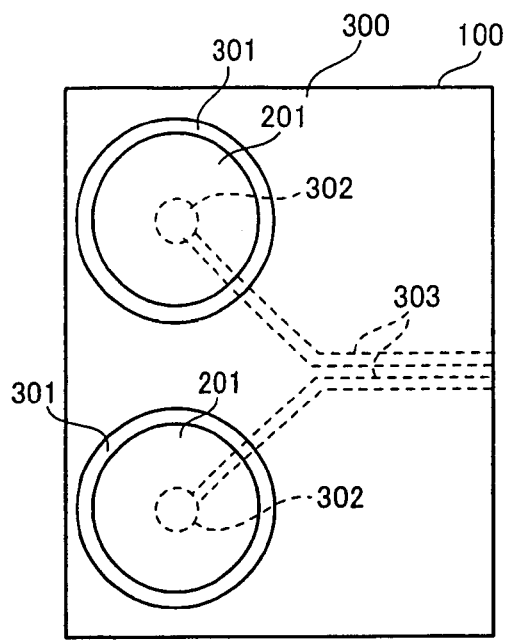
FIG. 2 illustrates a pad having a conventional shape.

FIG. 2 illustrates a pad having a conventional shape as a comparative example with respect to the present invention.

Only two pads are shown in FIG. 2, which correspond to two of the multiple pads 200 shown in FIG. 1. However, the shape of the pads shown in FIG. 2 is conventional.

On the surface of the printed board 100, there are formed pads 201 each consisting of a circular conductor pattern. Each of the pads 201 is surrounded by a broad grand pattern 300 with a small gap 301 formed therebetween. Each pad 201 is connected via a via 302 to a printed wire 303 that extends inside the layer of the printed board 100.

The area of each pad 201 shown in FIG. 2 equals to the area determined based on the circumference of the conductor pattern (area $S=\pi r^2$, where r is the radius of the circular conductor pattern).

Figure 3:
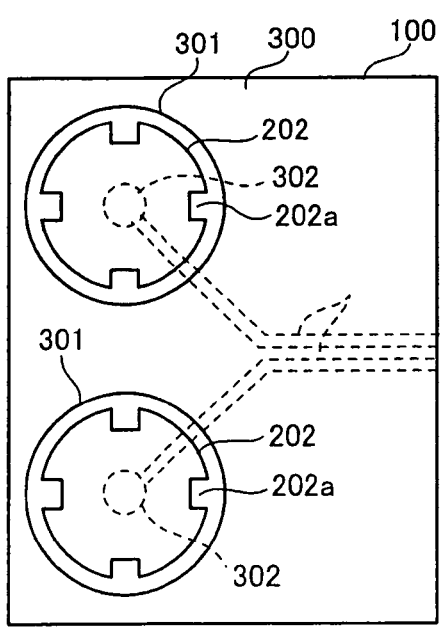
FIG. 3 shows a first example of a pad, which is applied to an embodiment of a printed board according to the present invention.

FIG. 3 shows a first example of a pad, which is applied to an embodiment of a printed board according to the present invention. In FIG. 3 and subsequent figures, the same components as those shown in FIG. 2 are indicated with the same reference characters as those shown in FIG. 2. Thus, only the difference will be described.

Pads 202 shown in FIG. 3 each consist of a circular conductor pattern with four indentations 202a formed in part of the circumference. Thus, the area of each pad 202 (or conductor pattern forming the pad) is smaller than the area determined based on the circumference of the conductor pattern ($S=\pi r^2$). The pad 202 is as resistant to vibrations or thermal strain as the pad shown in FIG. 2 because the circumference is substantially the same as that shown in FIG. 2. At the same time, the pad 202 has excellent high-speed transfer characteristic because the area of the conductor pattern is small.

Figure 4:
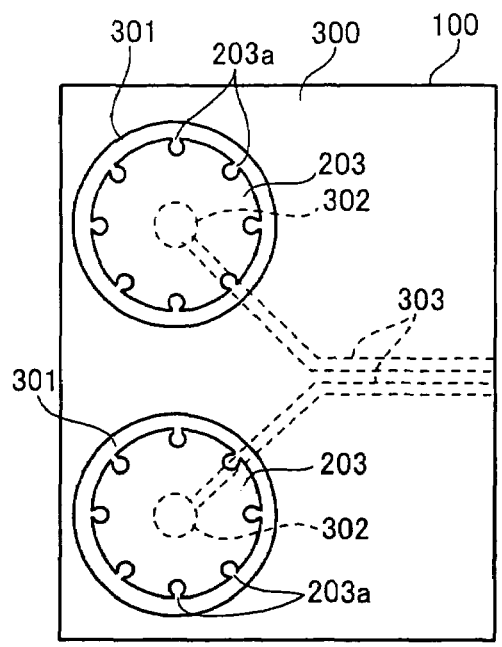
FIG. 4 illustrates a second example of a pad.

FIG. 4 illustrates a second example of a pad.

Pads 203 shown in FIG. 4 each consist of a circular conductor pattern with eight indentations 203a formed in part of the circumference. As with the first example, the circumference is substantially the same as that shown in FIG. 2 while the area of its conductor pattern is decreased. Therefore, the pad 203 also has both sufficient resistance and excellent high-speed transfer characteristic.

Figure 5:
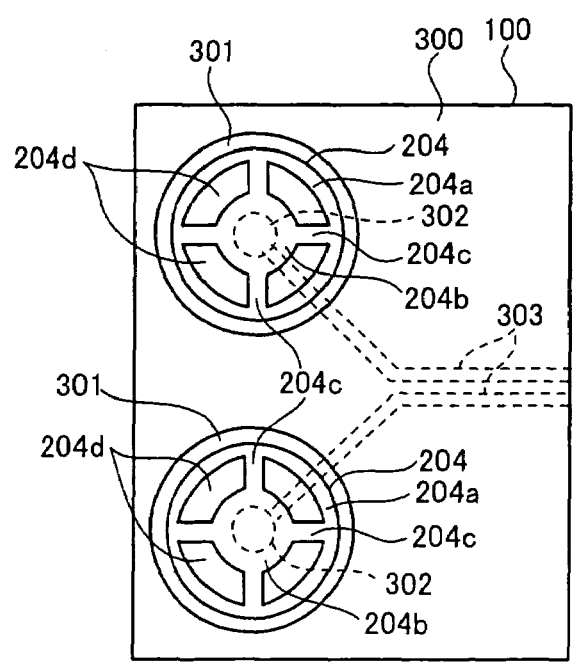
FIG. 5 illustrates a third example of a pad.

FIG. 5 illustrates a third example of a pad.

Pads 204 shown in FIG. 5 each have a ring section 204a, a center section 204b that extends to cover a via 302, and four connection sections 204c connecting the ring section 204a with the center section 204b. The shape of each pad 204 remains circular but each of the pads 204 has four openings 204d where no conductor pattern is formed. Thus, as with the above first and second examples, the pad 204 has both sufficient resistance and excellent high-speed transfer characteristic. The difference between the transfer characteristic of the conventional pad shown in FIG. 2 and that of the pad shown in FIG. 5 will be described later.

Figure 6:
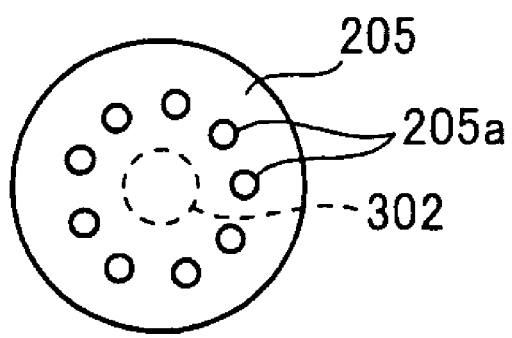
FIG. 6 illustrates a fourth example of a pad.

FIG. 6 illustrates a fourth example of a pad.

In FIG. 6 and subsequent figures, only a pad is illustrated.

A pad 205 shown in FIG. 6 has multiple circular small openings 205a formed therein except for the center part where a via 302 is formed. The pad 205 has the same resistance as the pad shown in FIG. 2 as the circumference is the same as the pad shown in FIG. 2. At the same time, the pad 205 has more excellent transfer characteristic than the pad in FIG. 2 as the area of the conductor pattern is decreased due to the openings 205a.

Figure 7:
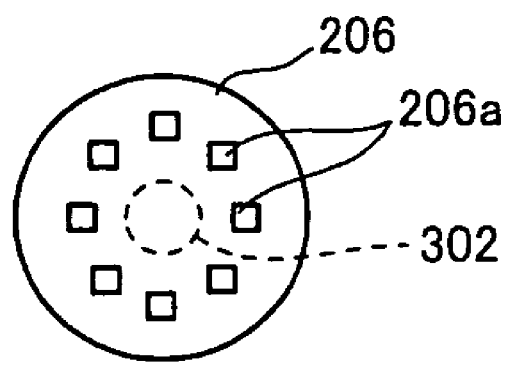
FIG. 7 illustrates a fifth example of a pad.

FIG. 7 illustrates a fifth example of a pad.

A pad 206 shown in FIG. 7 has multiple rectangular small openings 206a formed therein except for the center part where a via 302 is formed. As in the case of FIG. 6, the pad 206 has both sufficient resistance and excellent high-speed transfer characteristic.

Now, various examples of pads without a via will be described below.

Figure 8:
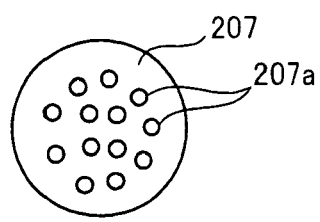
FIG. 8 illustrates a sixth example of a pad.

FIG. 8 illustrates a sixth example of a pad.

A pad 207 shown in FIG. 8 has multiple circular small openings 207a formed in the entire surface including the center part. As with the above examples, the pad 207 has both sufficient resistance and excellent high-speed transfer characteristic.

Figure 9:
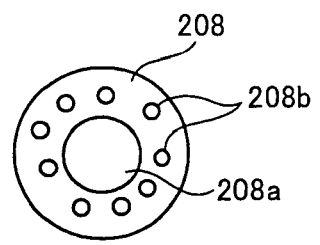
FIG. 9 illustrates a seventh example of a pad.

FIG. 9 illustrates a seventh example of a pad.

A pad 208 shown in FIG. 9 is ring-shaped and has a large circular opening 208a in the center. In the ring shaped part, multiple circular small openings 208b are formed. As with the previous examples, the pad 208 has sufficient resistance by maintaining the circumference while having excellent high-speed transfer characteristic by decreasing the area of the conductor pattern.

Figure 10:
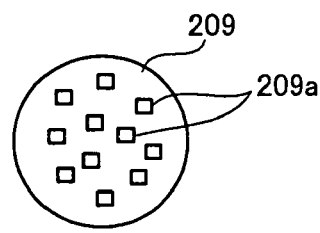
FIG. 10 illustrates an eighth example of a pad.

FIG. 10 illustrates an eighth example of a pad.

A pad 209 shown in FIG. 10 has multiple rectangular small openings 209a formed in the entire surface including the center part. As with the previous examples, the pad 209 has both sufficient resistance and excellent high-speed transfer characteristic.

Figure 11:
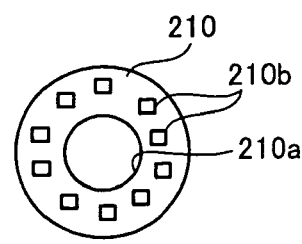
FIG. 11 illustrates a ninth example of a pad.

FIG. 11 illustrates a ninth example of a pad.

A pad 210 shown in FIG. 11 is ring-shaped and has a large circular opening 210a in the center. In the ring shaped part, multiple rectangular small openings 210b are formed. As with the previous examples, the pad 210 has sufficient resistance by maintaining the circumference while having excellent high-speed transfer characteristic by decreasing the area of the conductor pattern.

Figure 12:
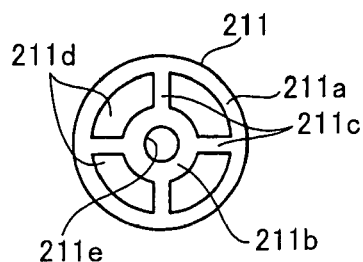
FIG. 12 illustrates a tenth example of a pad.

FIG. 12 illustrates a tenth example of a pad.

A pad 211 shown in FIG. 12 has an outer ring 211a, an inner ring 211b, and four connection sections 211c connecting the ring 211a with the ring 211b. The pad 211 also has: four openings 211d that are interposed between the rings 211a and 211b and partitioned by the connection sections 211c; and a circular opening 211e that is surrounded by the innter ring 211b.

As with the previous examples, the pad 211 has sufficient resistance by maintaining the circumference while having excellent high-speed transfer characteristic by decreasing the area of the conductor pattern.

Figure 13:
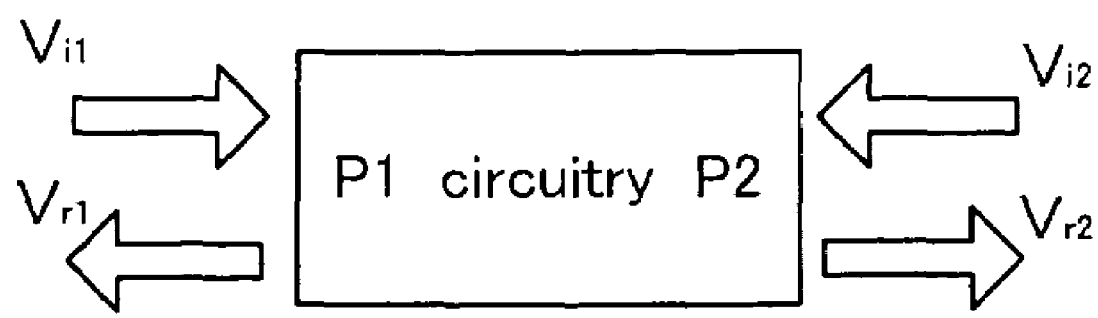
FIG. 13 is an explanatory drawing of S parameter.

FIG. 13 is an explanatory drawing of S parameter.

Assume $V_{i1}$ and $V_{i2}$ are traveling waves input to a circuitry and $V_{r1}$ and $V_{r2}$ are responses to the input, the relation can be expressed by the following equation. Here, $S_{11}$, $S_{12}$, $S_{21}$, $S_{22}$ are S parameters (Scattering Parameters).

$$\begin{bmatrix} V_{r1} \\ V_{r2} \end{bmatrix} = \begin{bmatrix} S_{11} & S_{12} \\ S_{21} & S_{22} \end{bmatrix} \begin{bmatrix} V_{i1} \\ V_{i2} \end{bmatrix}$$

When a signal $V_{i1}$ is input through a port P1 while no signal is input through a port P2 ($V_{i2}=0$), $S_{11}$ represents the mount of reflection returning to the port P1 ($V_{r1}$) and $S_{12}$ represents the amount of traveling (transmitting) to the port P2.

Figure 14:
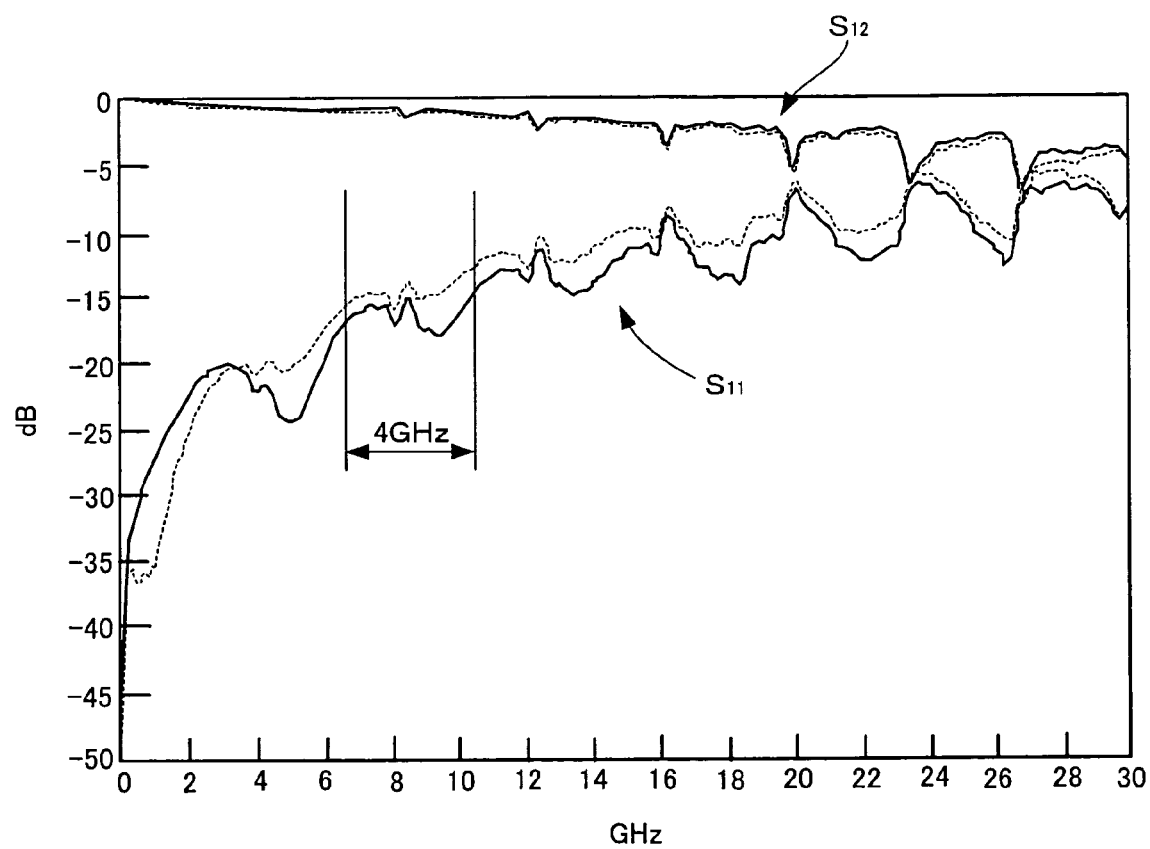
FIG. 14 is a graph showing $S_{11}$ and $S_{12}$ of each of the conventional example shown in FIG. 2 and the third example shown in FIG. 5.

FIG. 14 is a graph showing $S_{11}$ and $S_{12}$ of each of the conventional example shown in FIG. 2 and the third example shown in FIG. 5.

In FIG. 14, the horizontal axis shows frequency (GHz) and the lateral axis shows attenuation level (dB). A broken line indicates the conventional example shown in FIG. 2, whereas a solid line indicates the third example shown in FIG. 5. In the graph shown in FIG. 14, the upper two lines are $S_{12}$ and the lower two lines are $S_{11}$.

As for $S_{12}$, the two lines show approximately the same property. However, as for $S_{11}$, the transfer characteristic of the third example shown in FIG. 5 has been improved by about 4 GHz when these examples are compared at −15 dB.

Although only one example is described here, this improvement in transfer characteristic is a result of the decrease in the area of the conductor pattern forming the pad.

What is claimed is:

1. A printed board comprising:
    a connector pad consisting of a conductor pattern,
    wherein an area of the conductor pattern forming the pad is smaller than an area determined based on the circumference of the conductor pattern that forms the pad,
    wherein the connector pad is soldered to a signal electrode,
    wherein said conductor pattern has openings and/or indentations; and said openings and/or indentations have about the same thickness as said connector pad
    wherein the conductive pattern is connected to only a single wire within the printed board and said wire has a circumference less than said circumference of the conductor pattern.

2. A printed board according to claim 1, comprising a LSI surface-mounted thereto,
    wherein the pad is soldered to the LSI.

3. A printed board according to claim 1, wherein the pad consists of a conductor pattern whose circumference is partially indented.

4. A printed board according to claim 1, wherein the pad consists of a conductor pattern having an opening.

* * * * *